(12) United States Patent
Allen

(10) Patent No.: US 6,725,029 B1
(45) Date of Patent: Apr. 20, 2004

(54) COMPACT, SPACE EFFICIENT, SUB-HARMONIC IMAGE REJECT MIXER

(75) Inventor: Barry R. Allen, Redondo Beach, CA (US)

(73) Assignee: Northrop Grumman Corporation, Redondo Beach, CA (US)

(*) Notice: Subject to any disclaimer, the term of this patent is extended or adjusted under 35 U.S.C. 154(b) by 0 days.

(21) Appl. No.: 09/523,088

(22) Filed: Mar. 10, 2000

(51) Int. Cl.[7] ............................................... H04B 1/10
(52) U.S. Cl. ....................... 455/302; 455/296; 455/303
(58) Field of Search ................................. 455/302, 304, 455/307, 326, 315, 333, 296, 63, 501, 323, 334, 303, 318, 317

(56) References Cited

U.S. PATENT DOCUMENTS

| | | | | |
|---|---|---|---|---|
| 4,457,022 A | * | 6/1984 | Dydyk ........................ | 455/317 |
| 5,870,670 A | * | 2/1999 | Ripley et al. ................ | 455/304 |
| 5,950,119 A | * | 9/1999 | McGeehan et al. .......... | 455/302 |
| 6,029,059 A | * | 2/2000 | Bojer .......................... | 455/326 |
| 6,195,539 B1 | * | 2/2001 | Galal et al. .................. | 455/302 |
| 6,226,509 B1 | * | 5/2001 | Mole et al. .................. | 455/302 |
| 6,324,388 B1 | * | 11/2001 | Souetinov .................... | 455/302 |

OTHER PUBLICATIONS

Hayashi et al., "Millimeter–Wave–Band Amplifier and Mixer MMIC's Using a Broad–Band 45° Power Divider/Combiner," Jun. 1998, IEEE Transactions on Microwave Theory and Techniques, vol. 46, No. 6.

* cited by examiner

*Primary Examiner*—Sonny Trinh
(74) *Attorney, Agent, or Firm*—Harness, Dickey & Pierce, P.L.C.

(57) ABSTRACT

An image reject sub-harmonic mixer that employs less components than known image reject mixers. The mixer includes a 90° RF coupler, two high pass filters, two anti-parallel diode pairs, two low pass filters and a 90° IF coupler. RF and LO signals are applied to isolated input ports of the 90° coupler. In-phase and quadrature-phase copies of the RF and LO signals are provided at output ports of the coupler. The diode pairs mix the RF and LO signals to generate first and second intermediate frequency signals that are separated in-phase. The high pass filters reject the IF signals to prevent IF power from coupling to the RF and LO ports of the coupler. The low pass filters pass the IF signal and reject the LO and RF signals. Image rejection is obtained by combining the IF outputs of the two diode pair in the 90° IF hybrid.

9 Claims, 2 Drawing Sheets

COMPACT, SPACE EFFICIENT, SUB-HARMONIC IMAGE REJECT MIXER

BACKGROUND OF THE INVENTION

1. Field of the Invention

This invention relates generally to an image reject sub-harmonic mixer and, more particularly, to an image reject sub-harmonic mixer that includes an RF 90° hybrid, two high pass filters, two diode pair mixers, two low pass filters, and an intermediate frequency 90° hybrid to provide reduced components over existing sub-harmonic mixers.

2. Discussion of the Related Art

Image reject sub-harmonic mixers are known in the art for mixing RF and local oscillator (LO) signals. These mixers are typically used in many communications systems, such as radio and radar communications systems, for frequency down-conversion purposes. Frequency down-conversion includes mixing the received RF signal with a local oscillator (LO) signal to generate an intermediate frequency (IF) signal suitable for signal processing. Mixing the received RF signal with the LO signal generates sum and difference signals from these two signals, where the low frequency difference signal is used as the IF signal and the sum signal is filtered out. Sub-harmonic mixers have an advantage over conventional mixers because it is easier to generate the fundamental LO signal from which the effective LO signal is used for the mixing, especially at higher frequencies (GHz).

Typically, the fundamental LO signal is selected to be about one-half of the frequency of the received RF signal so that the second harmonic of the fundamental LO signal is near the frequency of the RF signal. The second harmonic or effective LO signal is the signal that is actually mixed with the RF signal to generate the IF signal. The mixing process generates responses at the effective LO frequency, plus and minus the IF frequency. The image reject mixer rejects one of the responses as an image signal by selective phasing, so that it does not interfere with the signal processing as noise or the like.

The conventional image reject sub-harmonic mixer is implemented using two identical mixers with separate power dividers driving the LO and RF ports. FIG. 1 is a schematic diagram of a conventional image reject sub-harmonic mixer 10. An RF input signal is applied to an input port of a 90° RF hybrid 12 (power divider), and in-phase and quadrature phase RF signals are provided at the output ports of the hybrid 12. The in-phase RF signal is applied to an RF band-pass filter 14 and the quadrature phase RF signal is applied to an RF band-pass filter 16. An LO signal is applied to an in-phase LO hybrid 18 (power divider) that splits the LO signal into copies of itself that are in-phase with each other. One of the LO signals is applied to an LO band-pass filter 20 and the other LO signal is applied to an LO band-pass filter 22.

The RF and effective LO signals from the filters 14 and 20 are mixed by an anti-parallel diode pair 24 to generate an in-phase IF signal that is the difference between the RF signal and the effective LO signal. Likewise, the RF and the effective LO signals from the filters 16 and 22 are mixed by an anti-parallel diode pair 26 to generate a quadrature phase IF signal that is the difference between the RF signal and the effective LO signal. The in-phase and the quadrature phase IF signals are 90° apart in phase. Low pass filters 28 and 30 are provided to pass the IF signals from the diode pairs 24 and 26, respectively, and reject the high frequency RF and LO signals.

The in-phase and quadrature phase IF signals are combined in a power combiner or 90° IF hybrid 32. Proper phasing is provided in the RF and LO hybrids 12 and 18 and the IF hybrid 32 to reject the image signal relative to the desired IF frequency. The LO hybrid 18 provides in-phase LO signals to the LO ports of the two diode pairs 24 and 26, and the RF hybrid 12 provides a 90-degree phase shift between the RF ports of the two diode pairs 24 and 26. The IF hybrid 32 provides 90-degree phasing to reduce the undesirable sideband. In this design, the upper sideband is provided on the lower output port of the hybrid 32, and the lower sideband is provided at the upper output port of the hybrid 32.

To maintain RF and LO signal separation to drive the mixer diode pairs 24 and 26 in the conventional sub-harmonic mixer 10, each diode pair 24 and 26 requires separate bandpass, low pass or high pass filters to eliminate undesired coupling among the RF, LO and IF signals. This implementation thus requires six separate filters, one at each of the LO, RF and IF frequencies for each mixer. Additionally, two power dividers for the LO and RF signals and one power combiner for the IF signal are required to implement the conventional image reject subharmonic mixer.

Typically, sub-harmonic mixers are implemented in a monolithic circuit in state-of-the-art receivers. Thus, there is a need in the art to simplify the circuitry required for an image reject sub-harmonic mixer to reduce hardware requirements and reduce the physical area required for the mixer. Reducing the number of components also reduces the cost of the mixer. It is therefore an object of the present invention to provide such a sub-harmonic mixer.

SUMMARY OF THE INVENTION

In accordance with the teachings of the present invention, an image reject sub-harmonic mixer is disclosed that employs less components than the image reject mixers known in the art. In one embodiment, the mixer includes a four-port 90° RF coupler, two high pass filters, two anti-parallel diode pairs, two low pass filters and a 90° IF coupler. RF and LO signals are applied to isolated input ports of the 90° RF coupler. The RF coupler generates in-phase and quadrature phase RF and LO signals at the two output ports of the RF coupler. The RF and LO signals at one of the output ports of the RF coupler is applied to a first bandpass filter and the RF and LO signals at the other output port of the RF coupler are applied to a second high pass filter.

The anti-parallel diode pairs provide the mixing of the RF and effective LO signals, and generate two IF signals that are 90° apart in phase. The high pass filters reject the IF signal to prevent IF power from coupling to the RF and LO ports of the RF coupler. The low pass filters pass the IF signals and reject the LO and RF signals. Image rejection is obtained by combining the IF outputs of the two diode pairs in the 90° IF hybrid to separate the upper and lower sidebands of the effective LO signal.

Additional objects, features and advantages of the present invention will become apparent from the following description and appended claims taken in conjunction with the accompanying drawings.

DETAILED DESCRIPTION OF THE PREFERRED EMBODIMENTS

The following discussion of the preferred embodiments directed to an image reject sub-harmonic mixer is merely exemplary in nature and is in no way intended to limit the invention or its applications or uses.

Figure 2:
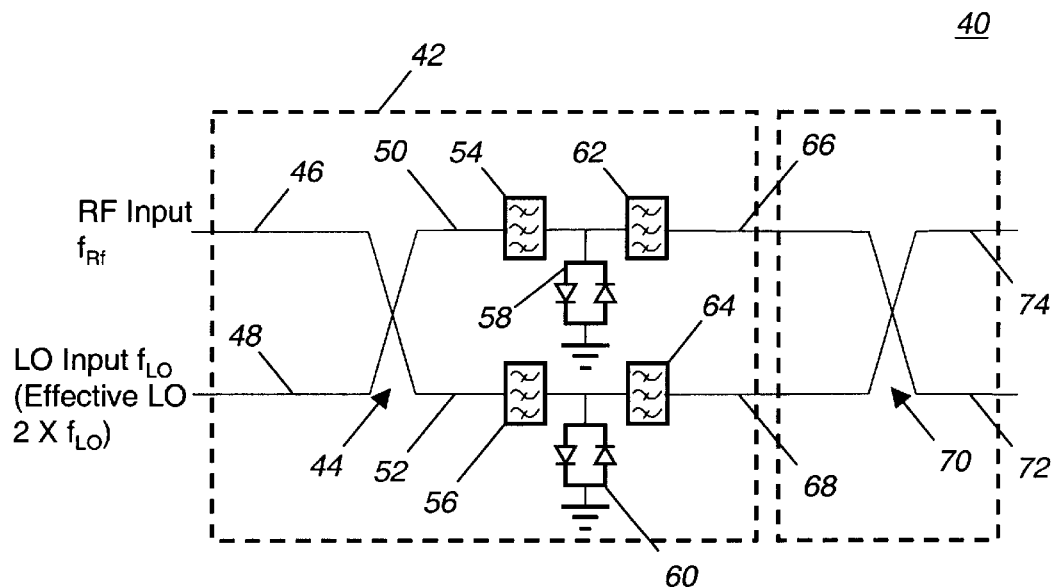
FIG. 2 is a schematic diagram of an image reject sub-harmonic mixer, according to an embodiment of the present invention.

FIG. 2 is a schematic diagram of an image reject sub-harmonic mixer system 40, according to an embodiment of the present invention. The mixer system 40 includes an I/Q (in-phase/quadrature phase) mixer 42 that can be, for example, fabricated as a monolithic millimeter-wave integrated circuit (MMIC). The mixer 42 includes a 90° RF hybrid 44 that acts as a 3 dB directional signal coupler and power divider. In one embodiment, the hybrid 44 is a Lange coupler, but any coupler known in the art suitable for the purposes described herein can be used. An input port 46 and an isolated port 48 are provided at an input side of the hybrid 44. An output port 50 and an output port 52 are provided at an output side of the hybrid 44. An input signal applied to the input port 46 is isolated from the port 48, and is provided as an in-phase copy of itself at the output port 50 and −90° quadrature phase copy of itself at the output port 52, so that the two signals at the ports 50 and 52 are 90° apart in phase. The same type of coupling occurs for a signal applied to the isolated port 58, where the in-phase signal is at the output port 52 and the quadrature phase signal is at the output port 50.

An RF signal received by an antenna (not shown) is applied to the port 46 from a low noise amplifier (not shown), or some other receiver component, and an LO signal from a suitable frequency source, such as a phase-locked loop (not shown), is applied to the port 48. The LO signal is about one-half of the frequency of the RF, so that the second harmonic of the LO signal, or the effective LO signal, is near the frequency of the RF signal. In this design, the mixer 42 mixes the RF signal with the effective LO signal to generate the IF signal. The IF signal desired is the difference between the RF signal and the effective LO signal. Both of the RF and the LO signals are provided at the output ports 50 and 52 with the phase relationship as discussed above. Because the LO signal is one-half the frequency of the effective LO signal, the phase shift of the effective LO signal at the port 50 is 180° relative to the LO signal at the port 48. Thus, the 90° phase shift of the fundamental LO signal becomes a 180° phase shift of the effective LO signal.

The RF and LO signals at the port 50 are applied to a high pass filter 54 and the RF and LO signals at the port 52 are applied to a high pass filter 56. The high pass filters 54 and 56 are designed to pass the frequencies of the RF and LO signals and reject the frequency of the IF signals. Therefore, the IF signals generated by the mixing process, as will be discussed below, are prevented from entering the output ports 50 and 52 of the hybrid 44. Thus, the filters 54 and 56 help prevent loss of the IF signals. The high pass filters 54 and 56 can be any filter suitable for the purposes described herein.

The RF and LO signals that are passed by the filters 54 and 56 are mixed by separate anti-parallel diode pairs 58 and 60, respectively. The diode pairs 58 and 60 include two parallel diodes connected so that they have opposite polarities, as shown. Employing anti-parallel diode pairs for high frequency mixing in an image reject sub-harmonic mixer of the type being described herein is well know to those skilled in the art. Schottky barrier diodes are typically employed in anti-parallel diode pairs used for this purpose. The non-linear conduction of the operation of the diodes, where the current through the diodes goes up exponentially with applied voltage, provides an effective mixing of the second harmonic of the LO signal and the RF signal. The mixing process generates sum and difference signals between the RF signal and the effective LO signal, where the frequency of the fundamental LO signal is selected to provide a difference frequency suitable to provide an IF signal for effective signal processing.

Low pass filters 62 and 64 are provided to pass the difference signal between the RF signal and the effective LO signal, and reject the RF signal, the LO signal, the effective LO signal and the sum signal. Therefore, duplicates of the IF signal that are 90° apart in phase, i.e., in-phase and quadrature phase signals of the IF signal, are provided at IF output ports 66 and 68 of the mixer 42. The IF signal that is the in-phase or quadrature phase signal on the ports 66 and 68 depends on whether the frequency of the effective LO signal is above or below the frequency of the RF signal. The in-phase and/or quadrature phase IF signals can be used for subsequent signal processing as the downconverted RF input signal, as is well understood in the art.

Both of the IF signals on the ports 66 and 68 include responses at the upper and lower sidebands of the effective LO signal. The upper sideband would be the IF signal equal to the RF signal minus the effective LO signal, and the lower sideband would be the IF signal equal to the effective LO signal minus the RF signal. One of the upper and lower sideband signals is an image signal, and is typically undesired. The image-reject mixer rejects the image signal so that it does not interfere with the usable IF signal.

Figure 1:
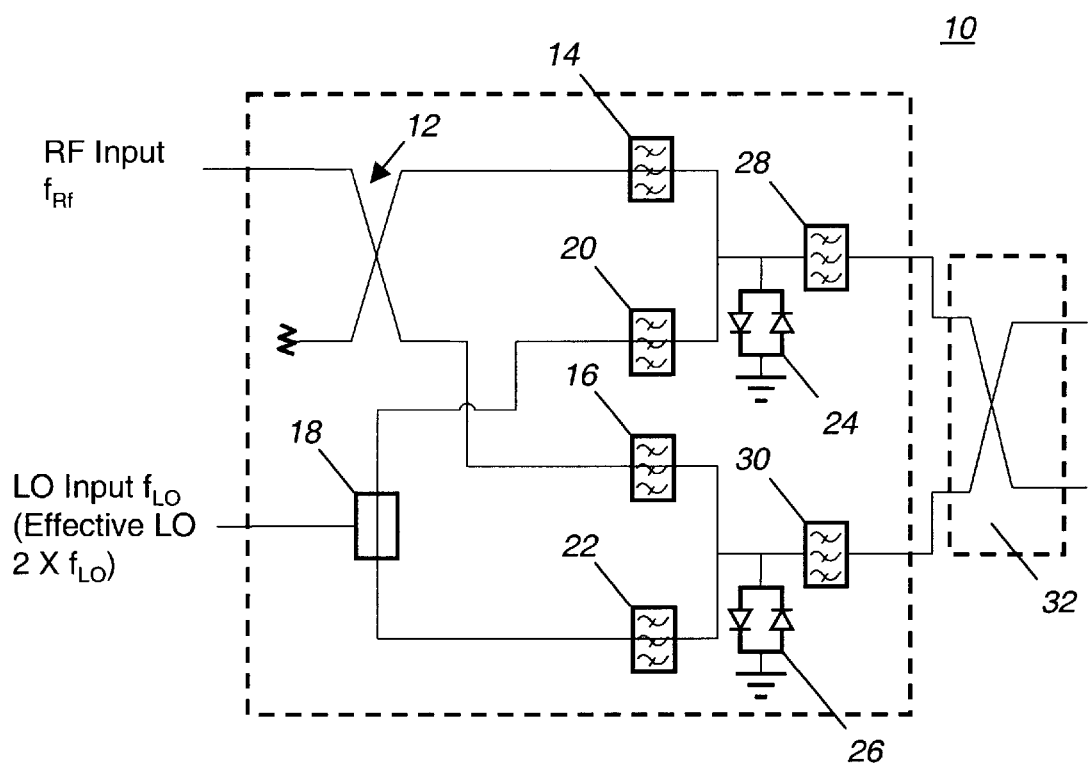
FIG. 1 is a schematic diagram of a conventional image reject sub-harmonic mixer.

Because the IF signal is provided as in-phase and quadrature phase signals at the ports 66 and 68, the effective LO signal can be separated into its upper and lower sidebands, so that the image signal is separated. The IF signals on the ports 66 and 68 are applied to input ports of a 90° hybrid 70 to separate the upper sideband and the lower sideband of the effective LO signal. The hybrid 70 operates in the same manner as the hybrid 44, and can also be any type of coupler suitable for the purposes described herein. Because the signals at the ports 66 and 68 have the same frequency, but different phases, the phase relationship resulting from the coupling provides separated signals that are the upper sideband and the lower sideband of the effective LO signal. In this design, the effective LO signal is applied with a 180 degree phase shift between diode pairs 58 and 60, so the upper sideband is provided at the output port 72 and the lower sideband is provided at the output port 74. This is opposite to the mixer 10 where the upper sideband is provided at the lower port of the hybrid 32 and the lower sideband is provided at the upper port of the hybrid 32. Although the preceding description describes operation of the compact, space efficient sub-harmonic image reject mixer as a frequency downconverter, the present embodiment functions equally well as a frequency upconverter. For upconverter operation, a low frequency signal is applied to either part 72 or 74 of FIG. 1 depending on whether the desired output signal from port 46 is the sum of the effective LO or the difference between the effective LO and the input.

For a particular design, the mixer 40 has an 8.5 dB conversion loss, more than 20 dB image rejection and a chip area less than 2 square mm. The RF signal is 44 GHz, the LO signal is 19.5 GHz, the effective LO signal is 39 GHz, and the IF signal is 5 GHz.

Figure 3:
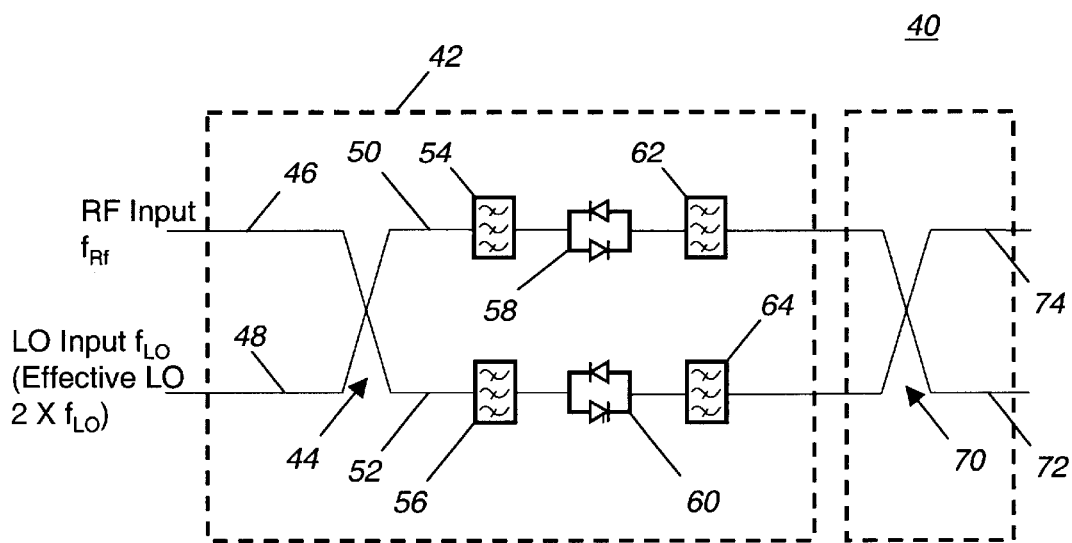
FIG. 3 is a schematic diagram of another image reject sub-harmonic mixer providing a short circuit at DC, according to another embodiment of the present invention.

The configuration of the diode pairs 58 and 60 in FIG. 2 in conjunction with the high pass filters 54 and 56 provides open circuit at DC. FIG. 3 shows a schematic diagram of the mixer system 40 where the diode pairs 58 and 60 are connected between the high pass filters 54 and 56 and the low pass filters 62 and 64, as shown. In the embodiment of FIG. 3, the high pass filters 54 and 56 provide a short circuit at DC.

The foregoing discussion discloses and describes merely exemplary embodiments of the present invention. In particular this embodiment of an image reject mixer without the output hybrid 70, may also be used as an n-phase and quadrature-phase downconverter, upconverter or modulator. One skilled in the art will readily recognize from such discussion, and from the accompanying drawings and claims, that various changes, modifications and variations can be made therein without departing from the spirit and scope of the invention as defined in the following claims.

What is claimed is:

1. An image reject sub-harmonic mixer, said mixer comprising:
    a first coupler, said first coupler being responsive to an RF input signal and a local oscillator signal, said first coupler outputting in-phase and quadrature phase signals of the RF signal and the local oscillator signal at a first output port and a second output port;
    a first high pass filter responsive to the RF signal and the local oscillator signal from the first output port, said first high pass filter passing the RF signal and the local oscillator signal and rejecting low frequency signals;
    a second high pass filter responsive to the RF signal and the local oscillator signal from the second output port, said second high pass filter also passing the RF signal and the local oscillator signal and rejecting low frequency signals;
    a first anti-parallel diode pair electrically connected to the first high pass filter and being responsive to the RF signal and the local oscillator signal from the first high pass filter, said first diode pair mixing the RF signal and the local oscillator signal to generate a first intermediate frequency signal, said first high pass filter rejecting the first intermediate frequency signal;
    a second anti-parallel diode pair electrically connected to the second high pass filter and being responsive to the RF signal and the local oscillator signal from the second high pass filter, said second diode pair also mixing the RF signal and the local oscillator signal to generate a second intermediate frequency signal, said second high pass filter rejecting the second intermediate frequency signal, said first and second intermediate frequency signals being substantially the same signal separated in phase;
    a first low pass filter electrically connected to the first diode pair, said first low pass filter passing the first intermediate frequency signal and rejecting the RF signal and the local oscillator signal; and
    a second low pass filter electrically connected to the second diode pair, said second low pass filter passing the second intermediate frequency signal and rejecting the RF signal and the local oscillator signal.

2. The mixer according to claim 1 wherein the first coupler is 90° hybrid.

3. The mixer according to claim 1 wherein the first and second diode pairs mix the RF signal and the second harmonic of the local oscillator signal.

4. An image reject sub-harmonic mixer, said mixer comprising:
    a first coupler, said first coupler being responsive to an RF input signal and a local oscillator signal, said first coupler outputting in-phase and quadrature phase signals of the RF signal and the local oscillator signal at a first output port and a second output port;
    a first high pass filter responsive to the RF signal and the local oscillator signal from the first output port, said first high pass filter passing the RF signal and the local oscillator signal and rejecting low frequency signals;
    a second high pass filter responsive to the RF signal and the local oscillator signal from the second output port, said second high pass filter also passing the RF signal and the local oscillator signal and rejecting low frequency signals;
    a first anti-parallel diode pair electrically connected to the first high pass filter and being responsive to the RF signal and the local oscillator signal from the first high pass filter, said first diode pair mixing the RF signal and the local oscillator signal to generate a first intermediate frequency signal, said first high pass filter rejecting the first intermediate frequency signal;
    a second anti-parallel diode pair electrically connected to the second high pass filter and being responsive to the RF signal and the local oscillator signal from the second high pass filter, said second diode pair also mixing the RF signal and the local oscillator signal to generate a second intermediate frequency signal, said second high pass filter rejecting the second intermediate frequency signal, said first and second intermediate frequency signals being substantially the same signal separated in phase;
    a first low pass filter electrically connected to the first diode pair, said first low pass filter passing the first intermediate frequency signal and rejecting the RF signal and the local oscillator signal;
    a second low pass filter electrically connected to the second diode pair, said second low pass filter passing the second intermediate frequency signal and rejecting the RF signal and the local oscillator signal; and
    a second coupler, said second coupler including a first input port electrically connected to the first low pass filter and a second input port electrically connected to the second low pass filter, said first input port being responsive to the first intermediate signal and the second input port being responsive to the second intermediate signal, said second coupler generating an upper sideband output and a lower sideband output of the local oscillator signal.

5. The mixer according to claim 4 wherein the second coupler is a 90° hybrid.

6. An image reject sub-harmonic mixing system, said mixing system comprising:
    a first coupler, said first coupler being responsive to an RF input signal and a local oscillator signal, said first coupler outputting in-phase and quadrature phase signals of the RF signal and the local oscillator signal at a first output port and a second output port;
    a first mixer responsive to the RF signal and the local oscillator signal from the first output port, said first mixer mixing the RF signal and the local oscillator signal to generate a first intermediate frequency signal;
    a second mixer responsive to the RF signal and the local oscillator signal from the second output port, said second mixer mixing the RF signal and the local oscillator signal to generate a second intermediate frequency signal, said first and second intermediate frequency signals being substantially the same signal separated in phase;

a first high pass filter responsive to the RF signal and the local oscillator signal from the first output port, said first high pass filter passing the RF signal and the local oscillator signal and rejecting low frequency signals; and a second high pass filter responsive to the RF signal and the local oscillator signal from the second output port, said second high pass filter also passing the RF signal and the local oscillator signal and rejecting low frequency signals.

7. The system according to claim 6 wherein the first coupler is 90° hybrid.

8. The system according to claim 6 wherein the first and second mixers are anti-parallel diode pairs.

9. An image reject sub-harmonic mixing system, said mixing system comprising;

a first coupler, said first coupler being responsive to an RF input signal and a local oscillator signal, said first coupler outputting in-phase and quadrature phase signals of the RF signal and the local oscillator signal at a first output port and a second output port;

a first mixer responsive to the RF signal and the local oscillator signal from the first output port, said first mixer mixing the RF signal and the local oscillator signal to generate a first intermediate frequency signal;

a second mixer responsive to the RF signal and the local oscillator signal from the second output port, said second mixer mixing the RF signal and the local oscillator signal to generate a second intermediate frequency signal, said first and second intermediate frequency signals being substantially the same signal separated in phase;

a first low pass filter electrically connected to the first mixer, said first low pass filter passing the first intermediate frequency signal and rejecting the RF signal and the local oscillator signal; and a second low pass filter electrically connected to the second mixer, said second low pass filter passing the second intermediate frequency signal and rejecting the RF signal and the local oscillator signal.

* * * * *